(12) United States Patent
Varanasi

(10) Patent No.: US 9,411,529 B2
(45) Date of Patent: Aug. 9, 2016

(54) MAPPING BETWEEN PROGRAM STATES AND DATA PATTERNS

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/006,236

(22) Filed: Jan. 26, 2016

(65) Prior Publication Data

US 2016/0139848 A1 May 19, 2016

Related U.S. Application Data

(63) Continuation of application No. 14/077,702, filed on Nov. 12, 2013, now Pat. No. 9,280,456.

(51) Int. Cl.
*G06F 12/00* (2006.01)
*G06F 3/06* (2006.01)

(52) U.S. Cl.
CPC ............ *G06F 3/0638* (2013.01); *G06F 3/0604* (2013.01); *G06F 3/0673* (2013.01)

(58) Field of Classification Search
USPC ........................................................ 711/170
See application file for complete search history.

(56) References Cited

U.S. PATENT DOCUMENTS

| | | | |
|---|---|---|---|
| 6,469,931 B1 | 10/2002 | Ban et al. | |
| 2011/0093652 A1* | 4/2011 | Sharon | G06F 11/1072 711/103 |
| 2012/0278545 A1 | 11/2012 | Wu et al. | |
| 2013/0088923 A1 | 4/2013 | Kang | |
| 2013/0272071 A1 | 10/2013 | Moschiano et al. | |
| 2013/0275714 A1 | 10/2013 | Parthasarathy et al. | |

* cited by examiner

*Primary Examiner* — Jared Rutz
*Assistant Examiner* — Hamdy S Ahmed
(74) *Attorney, Agent, or Firm* — Brooks, Cameron & Huebsch, PLLC

(57) ABSTRACT

The present disclosure includes methods and apparatuses for mapping between program states and data patterns. One method includes mapping a data pattern to a number of program state combinations L corresponding to a group of memory cells configured to store a fractional number of data units per cell. The mapping can be based, at least partially, on a recursive expression performed in a number of operations, the number of operations based on a number of memory cells N within the group of memory cells and the number of program state combinations L.

20 Claims, 3 Drawing Sheets

| Index (I) | Cell-Frame of length = 2 | | Cost of the Frame |
|---|---|---|---|
| | Level in Cell 1 | Level in Cell 1 | |
| 0 | 0 | 0 | 0 |
| 1 | 0 | 1 | 1 |
| 2 | 1 | 0 | 1 |
| 3 | 0 | 2 | 2 |
| 4 | 1 | 1 | 2 |
| 5 | 2 | 0 | 2 |
| 6 | 0 | 3 | 3 |
| 7 | 1 | 2 | 3 |
| 8 | 2 | 1 | 3 |
| 9 | 3 | 0 | 3 |
| 10 | 0 | 4 | 4 |
| 11 | 1 | 3 | 4 |
| 12 | 2 | 2 | 4 |
| 13 | 3 | 1 | 4 |
| 14 | 4 | 0 | 4 |
| 15 | 0 | 5 | 5 |
| 16 | 1 | 4 | 5 |
| 17 | 2 | 3 | 5 |
| 18 | 3 | 2 | 5 |
| 19 | 4 | 1 | 5 |
| 20 | 5 | 0 | 5 |
| 21 | 1 | 5 | 6 |
| 22 | 2 | 4 | 6 |
| 23 | 3 | 3 | 6 |
| 24 | 4 | 2 | 6 |
| 25 | 5 | 1 | 6 |
| 26 | 2 | 5 | 7 |
| 27 | 3 | 4 | 7 |
| 28 | 4 | 3 | 7 |
| 29 | 5 | 2 | 7 |
| 30 | 3 | 5 | 8 |
| 31 | 4 | 4 | 8 |
| 32 | 5 | 3 | 8 |
| 33 | 4 | 5 | 9 |
| 34 | 5 | 4 | 9 |
| 35 | 5 | 5 | 10 |

Fig. 3

MAPPING BETWEEN PROGRAM STATES AND DATA PATTERNS

PRIORITY INFORMATION

This application is a Continuation of U.S. application Ser. No. 14/077,702 filed Nov. 12, 2013, the specification of which is incorporated herein by reference.

TECHNICAL FIELD

The present disclosure relates generally to semiconductor memory apparatus and methods, and more particularly, to mapping between program states and data patterns.

BACKGROUND

Memory devices are typically provided as internal, semiconductor, integrated circuits in computers or other electronic devices. There are many different types of memory including volatile and non-volatile memory. Volatile memory can require power to maintain its data (e.g., information) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, static random access memory (SRAM), resistance variable memory, such as phase change random access memory (PCRAM) and resistive random access memory (RRAM), and magnetic random access memory (MRAM), such as spin torque transfer random access memory (STTRAM), among others.

Memory devices can be combined to form a solid state drive (SSD). A solid state drive can include non-volatile memory such as NAND flash memory and/or NOR flash memory, and/or can include volatile memory such as DRAM, among various other types of non-volatile and volatile memory. Flash memory devices, including floating gate flash devices and charge trap flash (CTF) devices can comprise memory cells having a storage node (e.g., a floating gate or a charge trapping structure) used to store charge and may be utilized as non-volatile memory for a wide range of electronic applications.

Memory cells can be arranged in an array architecture and can be programmed to a desired state. For instance, electric charge can be placed on or removed from the storage node (e.g., floating gate) of a memory cell to place the cell into one of a number of program states. As an example, a single level cell (SLC) can be programmed to one of two program states which can represent a stored data unit (e.g., binary units 1 or 0). Various flash memory cells can be programmed to more than two program states, which can represent multiple stored data units (e.g., binary units 1111, 0111, 0011, 1011, 1001, 0001, 0101, 1101, 1100, 0100, 0000, 1000, 1010, 0010, 0110, or 1110). Such memory cells may be referred to as multi state cells, multiunit cells, or multilevel cells (MLCs). MLCs can allow the manufacture of higher density memories without increasing the number of memory cells since each cell can represent more than one digit (e.g., more than one bit).

Some MLCs can be programmed to a quantity (L) of program states that does not correspond to an integer number of stored data units. That is, the number of data units capable of being stored in a cell ($Log_2(L)$) can correspond to a fractional number of stored data units (e.g., a fractional number of bits).

BRIEF DESCRIPTION OF THE DRAWINGS

FIG. 3 illustrates an example mapping between data patterns and program states in accordance with a number of embodiments of the present disclosure.

DETAILED DESCRIPTION

Figure 1:
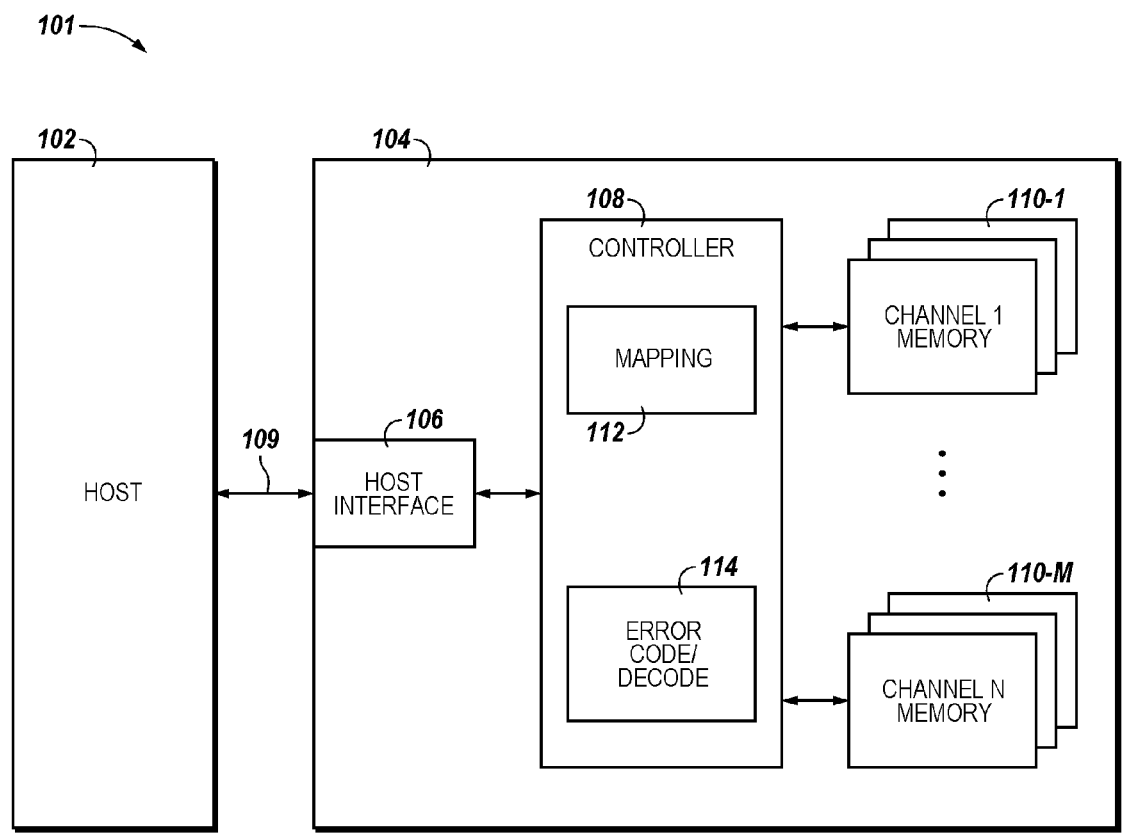
FIG. 1 is a block diagram of an apparatus in the form of a computing system including at least one memory system in accordance with a number of embodiments of the present disclosure.

The present disclosure includes methods and apparatuses for mapping between program states and data patterns. One method includes mapping a data pattern to a number of program state combinations L corresponding to a group of memory cells configured to store a fractional number of data units per cell, wherein the mapping is based, at least partially, on a recursive expression performed in a number of operations, the number of operations based on a number of memory cells N within the group of memory cells and the number of program state combinations L.

Embodiments of the present disclosure can provide a mapping (e.g., assignment) of program states to data patterns, and vice versa, in association with fractional unit per cell (fractional bit per cell) configurations, for instance. The mapping can allow for a mapping of a data pattern to a corresponding memory cell program state to a corresponding bit pattern in a consistent number of operations. Embodiments can also reduce the occurrence of higher program states in each memory cell in a memory cell array as compared to previous fractional bit per cell mapping algorithms. Higher program states my cause damage to memory, so reducing the occurrence of these higher program states can protect a memory cell and/or lengthen the memory cell's life.

As used herein, the designators "M", "N", "m", "j", "n", "c", "C", "I", "R", "F", and "L," etc., particularly with respect to reference numerals in the drawings, indicates that a number of the particular feature so designated can be included with a number of embodiments of the present disclosure. In a number of embodiments, a given designation may be the same or different from another designation. As used herein, "a number of" something can refer to one or more of such things.

FIG. 1 is a block diagram of an apparatus in the form of a computing system 101 including at least one memory system 104 in accordance a number of embodiments of the present disclosure. As used herein, a memory system 104, a controller 108, or a memory device 110 might also be separately considered an "apparatus". The memory system 104 can be a solid state drive (SSD), for instance, and can include a host interface 106, a controller 108 (e.g., a processor and/or other control circuitry), and a number of memory devices 110-1, ..., 110-M (e.g., solid state memory devices such as NAND flash devices), which provide a storage volume for the memory system 104. Also, in a number of embodiments, a memory (e.g., memory devices 110-1 to 110-M) can include a single memory device. For instance, M can equal one, such that there is a single memory array device 110 instead of a plurality.

As illustrated in FIG. 1, a host 102 can be communicatively coupled to a memory system 104, such as by a communication channel 109. Communication channel 109 can be located between the host 102 and the memory system 104, for example. Communication channel 109 can be a cable or bus, such as a serial advanced technology attachment (SATA), peripheral component interconnect express (PCIe), or a universal serial bus (USB), or other interface.

The controller 108 can be coupled to the host interface 106 and to the memory devices 110-1, . . . , 110-M via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory devices 110-1, . . . , 110-M to control data read, write, and erase operations, among other operations. The controller 108 can include, for example, a number of components in the form of hardware and/or firmware (e.g., one or more integrated circuits/logic) and/or software for controlling access to the number of memory devices 110-1, . . . , 110-M and/or for facilitating data transfer between the host 102 and memory devices 110-1, . . . , 110-M. For instance, in the example illustrated in FIG. 1, the controller 108 includes a mapping (e.g., data packer/unpacker) component 112 and an error code/decode component 114. However, the controller 108 can include various other components not illustrated so as not to obscure embodiments of the present disclosure. Also, the components 112 and/or 114 may not be components of controller 108, in some embodiments (e.g., the components 112 and/or 114 can be independent components).

The mapping component 112 can be used in association with mapping between memory cell program states and data in accordance with a number of embodiments described herein. The error code/decode component 114 can be an LDPC encoder/decoder, for instance, which can encode/decode user data transferred between host 102 and the memory devices 110-1, . . . , 110-M. For instance, the error code/decode component 114 can map units (e.g., bits) across a plurality of cells to achieve fractional bits per cell. Error code/decode component 114 can determine/assign a cell frame given and index and/or determine/assign an index given a cell frame, for example. In some instances, error code/decode component 114 can receive an m unit data pattern and determine a particular one of a number of program state combinations to which the m unit data pattern corresponds according to a cost-based mapping.

The memory devices 110-1, . . . , 110-M can include a number of arrays of memory cells. The arrays can be flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes.

As one example, a memory device may be configured to store 8 KB (kilobytes) of user data per page, 128 pages of user data per block, 2048 blocks per plane, and 16 planes per device.

In embodiments in which the memory devices 110-1, . . . , 110-M comprise flash arrays having a NAND architecture, the arrays can comprise access lines, e.g., word lines and intersecting data lines, e.g., bit lines. The arrays can comprise "strings" of memory cells connected in series source to drain between a source select gate configured to selectively couple a respective string to a common source and a drain select gate configured to selectively couple a respective string to a respective bit line. The memory cells can comprise, for instance, a source, a drain, a charge storage node (e.g., a floating gate), and a control gate, with the control gates of cells corresponding to a "row" of cells being commonly coupled to a word line. A NOR flash array would be similarly structured with the exception of strings of memory cells being coupled in parallel between select gates.

As one of ordinary skill in the art will appreciate, groups of flash cells coupled to a selected word line can be programmed and/or read together as a page of memory cells. A programming operation (e.g., a write operation), can include applying a number of program pulses (e.g., 16V-20V) to a selected word line in order to increase the threshold voltage (Vt) of selected cells coupled to that selected word line to a desired Vt level corresponding to a target (e.g., desired) program state. A read operation can include sensing a voltage and/or current change of a bit line coupled to a selected cell (e.g., responsive to a read voltage applied to the word line corresponding to the cell) in order to determine the program state of the selected cell.

As described further herein, in a number of embodiments of the present disclosure, a memory cell can be programmed to one of a quantity of program states corresponding to either an integer number of stored data units (e.g., bits) or a fractional number of stored data units. In a number of embodiments, the program states of a number of cells of a group of cells each storing a fractional number of bits can be combined such that the group of cells stores an integer number of bits. For instance, five program states can store $\log_2(5) \approx 2.322$ units. Four such cells can store 5*5*5*5=625 program states, or $\log_2(625) \approx 9.288$ bits.

In an example, a cell can be characterized as holding a certain non-integer number of bits in order to be cleanly divisible by a desired integer number for the group of cells to hold. In such an example, a group of cells are each programmed to one of five program states, such that each cell can store 2.25 bits. In this example, the combined program states of a group of four cells corresponds to 9 bits (2.25 bits/cell×4 cells). That is, a 9 bit data pattern can be stored in the group of four cells. As such, controller 108 can control programming and/or reading a group of cells each storing a fractional number of bits per cell and can output (e.g., to host 102) an m unit data pattern stored in the group, where m is an integer number data units (e.g., bits). The particular data pattern (e.g., bit pattern) to which the combination of determined program states of the group corresponds can be determined based on a mapping algorithm in accordance with a number of embodiments described herein.

Figure 2:
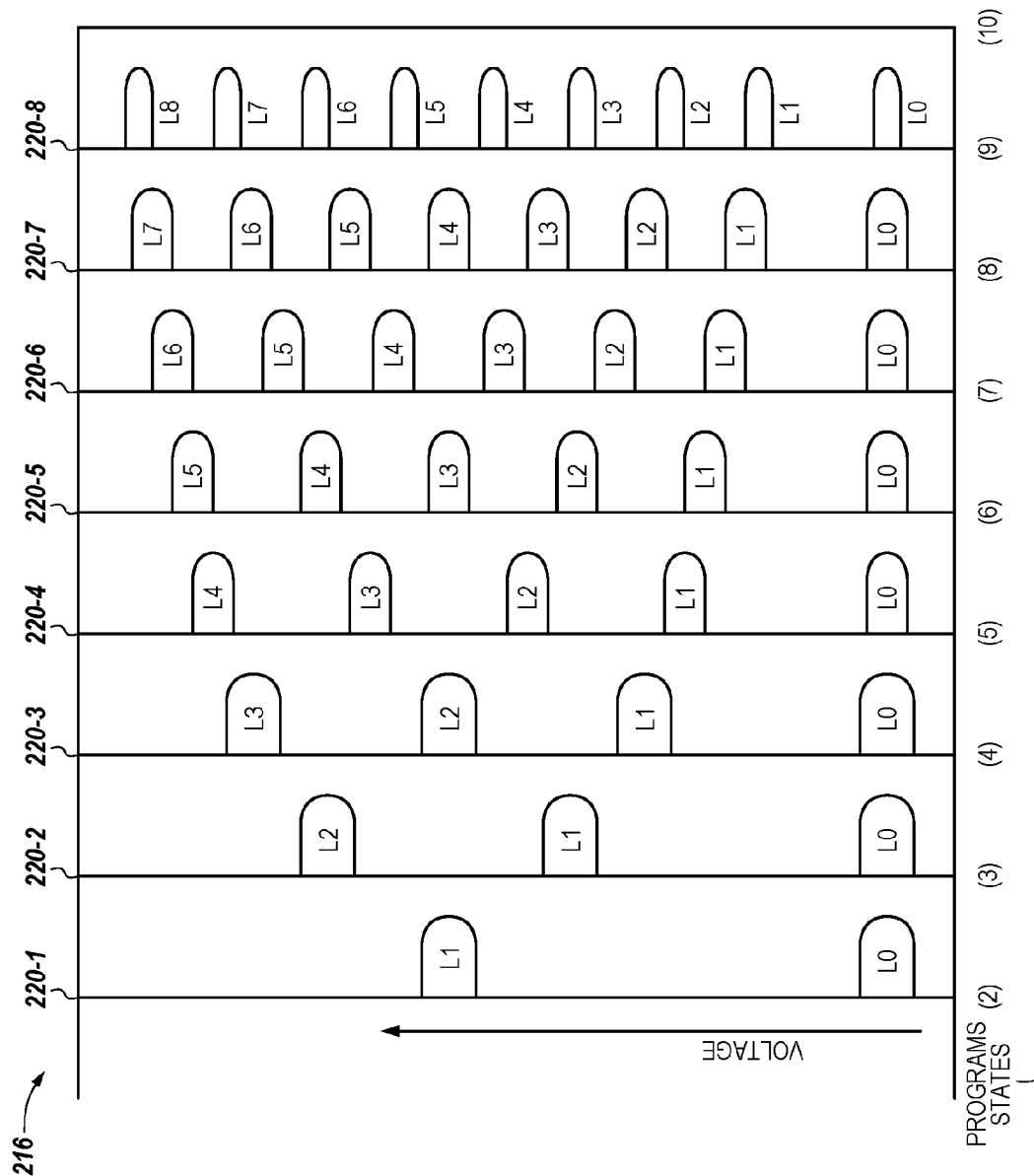
FIG. 2 is a diagram illustrating threshold voltage distributions corresponding to program states of memory cells programmable to different numbers of program states in accordance with a number of embodiments of the present disclosure.

FIG. 2 is a diagram 216 illustrating threshold voltage distributions corresponding to program states of memory cells programmable to different numbers of program states in accordance with a number of embodiments of the present disclosure. The memory cells can be NAND flash memory cells as described above and can be programmed to various Vt levels within a voltage range of about −2V to +3V; however, embodiments are not limited to a particular type of memory cell or to a particular operational voltage range.

Row 218 indicates the quantity of program states to which the memory cell may be programmed. The program states shown in FIG. 2 are labeled L0, L1, L2, etc., with each program state representing a distribution of Vt levels corresponding to the respective program states. In a number of embodiments, the program state L0 can be a lowermost program state (e.g., a program state corresponding to lowermost Vt levels) and may be referred to as an erase state since cells can be in a lowermost state after an erase operation; however, embodiments are not so limited.

In FIG. 2, column 220-1 corresponds to memory cells programmed to one of two different program states L0 and L1, and which can store $\log_2(2)$ (i.e., one) unit (e.g., bit) of data per cell. Column 220-2 corresponds to memory cells programmed to one of three different program states L0, L1, and L2, and which can store $\log_2(3)$ (i.e., about 1.5) units of data per cell. Column 220-3 corresponds to memory cells programmed to one of four different program states L0, L1, L2, and L3, and which can store $\log_2(4)$ (i.e., 2) units of data per cell. Column 220-4 corresponds to memory cells programmed to one of five different program states L0 to L4, and which can store $\log_2(5)$ (i.e., about 2.25) units of data per cell. Column 220-5 corresponds to memory cells programmed to one of six different program states L0 to L5, and which can store $\log_2(6)$ (i.e., about 2.5) units of data per cell. Column 220-6 corresponds to memory cells programmed to one of seven different program states L0 to L6, and which can store $\log_2(7)$ (i.e., about 2.75) units of data per cell. Column 220-7 corresponds to memory cells programmed to one of eight different program states L0 to L7, and which can store $\log_2(8)$ (i.e., 3) units of data per cell. Column 220-8 corresponds to memory cells programmed to one of nine different program states L0 to L8, and which can store $\log_2(9)$ (i.e., about 3.125) units of data per cell.

Memory cells programmable to a power of 2 quantity of program states (e.g., 2 program states, 4 program states, 8, program states, 16 program states, etc.) can individually store an integer number of bits per cell (e.g., $\log_2(L)$ bits/cell where L is the number of program states to which the cell is programmable). As such, the program state of each memory cell can be directly mapped to one of L different m bit data patterns where m is the integer quantity of bits stored in the cell. For instance, the program states of a cell programmable to two program states (L0 and L1) can be mapped to 0 or 1 (e.g., a 1 bit data pattern), the program states of a cell programmable to 4 program states (L0 to L3) can be mapped to 00, 01, 10, and 11, respectively (e.g., a 2 bit data pattern), and the program states of a cell programmable to 8 program states (L0 to L7) can be mapped to 000, 001, 010, 011, 100, 101, 110, and 111, respectively (e.g., a 3 bit data pattern).

In contrast, memory cells programmable to a non-power of 2 quantity of program states individually store a fractional (e.g., non-integer) number of bits per cell. As such, rather than program states of each individual cell mapping to an N bit data pattern, combinations of the L program states to which each individual cell of a group of cells is programmable are mapped to an N bit data pattern where N is an integer quantity of bits stored in the group. For instance, combinations of respective program states of a group of two memory cells programmable to three program states (L0, L1, and L2) (e.g., 1.5 bits/cell) are mapped to a 3 bit (e.g., 1.5 bits/cell×2 cells) data pattern (e.g., 000, 110, 100, etc.). Similarly, combinations of respective program states of a group of four memory cells programmable to five program states (L0 to L4) (e.g., 2.25 bits/cell) are mapped to a 9 bit (e.g., 2.25 bits/cell×4 cells) data pattern (e.g., 110011001, 000001111, 101010101, etc.), and combinations of respective program states of a group of eight memory cells programmable to 9 states (L0 to L8) (e.g., 3.125 bits/cell) are mapped to a 25 bit (e.g., 3.125 bits/cell×8 cells) data pattern (e.g., 0000011111000001111100000, 1010101010101010101010101, 1111111111111111110000000, etc.).

In general, for a group of cells collectively storing an integer number (m) of units of data (e.g., bits), but individually storing a fractional number of units of data, $2^m$ different m unit data patterns are mapped to a corresponding number (e.g., $2^m$) of different program state combinations of the group. As an example, consider a group of two cells each programmed to one of three program states (L0, L1, L2) such that the group collectively stores 3 bits of data (e.g., 1.5 bits/cell). As such, $2^3$ (e.g., 8) different 3 bit data patterns are mapped to $2^3$ (e.g., 8) different program state combinations of the group.

As described further below in connection with FIG. 3, a number of embodiments of the present disclosure can include receiving an m unit data pattern to be stored in (e.g., written to) a group of N memory cells such that each cell stores m/N units of data. The data pattern can be one of a number of data patterns to which combinations of program states of the N memory cells are mapped.

The memory cells can be fractional unit memory cells (e.g., m/N can be a non-integer) each programmable to one of L program states. In some examples, m is itself a non-integer. In such examples, m may be combined with other groups of N cells holding M units, which sums to an integer, for instance. Programming each memory cell of the group to a respective one of L program states can occur such that a combination of the program states of the group map to a received data pattern (e.g., an m unit data pattern). In a number of embodiments, L can be a minimum quantity of program states used to store m/N units of data per cell, with a cell capable of storing $\log_2(L)$ units of data per cell. As an example, a 9 unit data pattern (e.g., m=9) can be stored in a group of 4 memory cells (e.g., N=4) such that each memory cell stores 2.25 units of data per cell (e.g., m/N=2.25). In this example, the minimum number of program states need to store 2.25 data units per cell is 5 (e.g., L=5). That is, a group of 4 memory cells each programmable to one of 5 program states can store a 9 unit data pattern. Mapping between the particular program state combinations of the group of four cells and the respective 9 unit (e.g., 9 bit) data patterns to which they correspond can be determined in accordance with a number of embodiments described herein.

In a number of embodiments, mapping between program state combinations and data patterns is based on a recursive expression. The recursive expression can be used to map a data pattern to its corresponding memory cell program state and vice versa. For example, L can be the number of possible program states, hereinafter referred to as levels, stored in a cell, (e.g., levels 0, 1 . . . L−1). The cost of a level can be defined as its number, and in some embodiments, higher costs can be assigned to higher levels in the cell. The cost of a frame can correspond to a sum of the levels in the cells in the frame.

In addition, the cost (e.g., total cost) of a memory cell frame can be the sum of the costs of the cells in the memory cell frame (e.g., sum of a first half memory cell frame cost and a second half memory cell frame cost). N can be the number of such cells across which the intent is to map a bit-pattern of length m, and N can also be referred to as the memory cell frame length of the mapping. A mapping may be possible if $2^m \leq L^N$, and the recursive expression can relegate high-cost memory cell frames to the bottom of a mapping (e.g., mapping table 330), as will be discussed further herein with respect to FIG. 3). This way, for cases where $2^m<L^N$, the highest cost memory cell frames do not take part in the mapping. In a number of examples, N is an even number and mapping between program states and data patterns can include considering the first and second halves of the cost. In a some embodiments, the total cost can comprise a voltage level or levels of a respective program state or states.

In a number of embodiments, mapping between program states and data patterns according to the present disclosure can include receiving an m unit data pattern to be stored in a group of N memory cells. Each memory cell of the group can be programmable to L program states, and L can be a number of program states used to store m/N units of data per memory cell. A particular one of a number of program state combinations to which the m unit data pattern corresponds can be determined according to a cost-based mapping (e.g., as will be discussed further herein with respect to FIG. 3).

The cost-based mapping can include an associated program state (e.g., cell frame) having a length N, and the mapping can include an index corresponding to each one of the respective number of program state combinations and a total cost corresponding to each one of the respective number of program state combinations. Each of the L program states can have a different cost corresponding thereto.

In some examples, mapping between program states and data patterns according to the present disclosure can include reading a group of N memory cells, each programmable to L program states and determining a particular index for each of the respective frames according to the cost-based mapping. An example of the cost-based mapping is illustrated in FIG. 3.

FIG. 3 illustrates a mapping 300 between data patterns and program states in accordance with a number of embodiments of the present disclosure. The mapping 330 can be a cost-based mapping and can include indices 332, memory cell frame lengths 334 (e.g., including first half lengths 336 and second half lengths 338), and a cost 340 of each memory cell frame. Indices 332 can refer to an associated binary 5-unit data pattern (e.g., 5-bit pattern). For instance, an index of zero corresponds to pattern 00000, an index of 16 corresponds to pattern 10000, an index of 31 corresponds to pattern 11111, etc. The cost 340 of each memory cell frame can comprise the sum of first half memory cell frame lengths 336 and second half memory cell frame lengths 338 of each index. For instance, in row 343 (index 31), first half cost of a frame 4 plus second half cost of a frame 4 equal cost 8.

In a number of embodiments, the mapping is based on a recursive expression. Using the recursive expression, a data pattern can be directly mapped to its corresponding memory cell frame and vice versa. For instance, a binary pattern (e.g., corresponding to an index) can be directly mapped to a level. In a number of examples, table 330 is not maintained, but mapping still occurs.

In the example illustrated in FIG. 3, L=6, N=2, and m=5. Since $2^5<6^2$, each 5-bit data pattern can be mapped to a memory cell frame of length N=2, where, in each memory cell frame, a cell can assume any one of the possible L=6 levels (e.g., levels 0, 1, 2, 3, 4, 5). Since 5 bits are being mapped to 2 cells in this case, this results in 2.5 bits-per-cell mapping. The ordering of all the memory cell frames, together with the cost of each memory cell frame, is shown in table 330. In this example, higher cost memory cell frames appear in table 330 later than the lower cost memory cell frames. For example, row 344 comprising a cost 7 appears earlier than row 343 comprising cost 8. In contrast, if the rows were sorted by frame levels (e.g., columns 336 and 338), row 344 would appear later in table 330 than row 343 (e.g., 4, 4 in base 6 would earlier than 5, 2). In the example in table 330, the last four memory cell frames 342 in the table can be omitted (e.g., discarded, removed, disregarded, reserved) while still achieving a 2.5 bits-per-cell mapping, e.g., because only $2^5=32$ indices are needed. For instance, program states having indices greater than or equal to $2^m$ can be omitted. In some examples, these memory cell frames 342 (e.g., illegal memory cell frames) can be used for error detection purposes at the time of de-mapping a memory cell frame to a data-pattern.

The multiple-cell mapping can be applied to memory types in which memory cells store bits corresponding to a same page of data. For instance, in some prior approaches, cells can store bits corresponding to different pages of data (e.g., a first bit stored in the cell can correspond to a lower page of data and a second bit stored in the cell can correspond to an upper page of data). In such instances, the lower page bits can be written and/or read independently of the upper page bits. In contrast, mapping between program states and data patterns in accordance with embodiments of the present disclosure can be performed on memory types in which bits stored in the memory cells do not correspond to different pages of data. For instance, multiple bits stored in one memory cell can belong to a single page.

In a number of embodiments, rules can be utilized during mapping. For example, memory cell frames can be arranged in the order of increasing cost (Rule 1). For instance, in cost column 340, the costs increase from 0 to 10. Additionally or alternatively, among memory cell frames of the same cost, memory cell frames with lower first half costs appear first (e.g., Rule 2). For instance, the first half cost 2 in column 336, e.g., index 26, is lower than the first half cost 3 in column 348, e.g., index 27. In some examples, among memory cell frames of the same cost, memory cell frames with higher first half frame costs appear after those with lower first half frame costs. If two memory cell frames have equal cost and equal first half cost, then the one with the lower second half cost appears first (e.g., Rule 3). Arranging the memory cell frames in such a way can allow for finding the location of a memory cell frame in the list, or the reverse operation of finding a jth memory cell frame given the integer j, in $\log_2 N$ operations. While the rules in this example are labeled 1, 2, and 3, changing the order of the rules can be done in a number of embodiments.

Finding the index I of a memory cell frame F (e.g., decoding) can be performed recursively. For instance, let C be the cost of a memory cell frame of length n, $C_1$ be the cost of the first-half of the memory cell frame, $C_2$ be the cost of the second-half of the memory cell frame, $I_1$ be the index of the first-half among memory cell frames of length n/2, $I_2$ be the index of the second-half among memory cell frames of length n/2, and $L_n(c)$ be the number of memory cell frames of length n that have cost c.

As previously noted, $C=C_1+C_2$, and implementing Rule 1 can result in $\Sigma_{c=0}^{C-1} L_{n/2}(c) L_{n/2}(C-c)$ memory cell frames of length n preceding F. These memory cell frames can be followed by memory cell frames for which the first-half cost equals $C_1$, each of which can be the prefix of $I_2$ second-half memory cell frames of cost $C_2$.

$I_1$ first-half memory cell frames can form the prefix of the second-half memory cell frame of F, such that:

$$I=(\Sigma_{c=0}^{C-1} L_{n/2}(c) L_{n/2}(C-c))+I_2 * L_{n/2}(C_1)+I_1.$$

In a number of embodiments, applying the expression recursively beginning with n=N, the index of F can be determined in $\log_2 N$ operations. The expression can be the same for all fractional bits-per-cell cases. It does not change based on N, L, or m. Encoding an m-bit pattern to an N-memory cell frame takes $\log_2 N$ operations, regardless of L. For instance, if N=8, encoding takes $\log_2 8$=3 operations.

Using a polynomial convolution formula, the counts L(•) can be pre-computed before starting the recursion. Referring to the example in table 330, the counts can be $L_1(0)$=1, $L_1(1)$=1, $L_1(2)$=1, $L_1(3)$=1, $L_1(4)$=1, and $L_1(5)$=1. Arranging the values in a vector $L_1$=[1 1 1 1 1 1], a convolution of $L_1$ with itself generates $L_2$=[1 2 3 4 5 6 5 4 3 2 1], which is the number of memory cell frames of length 2 of cost 0, 1, 2 . . . 10. In general, the $L_n$ vector can be the convolution of $L_{n-1}$ vector with $L_1$. For instance, when a frame length equals 3, $L_3$ can be used, with a convolution of $L_3$=$L_2$×$L_1$.

In an example, finding the index of the memory cell frame F=[5 2] in table 330 (e.g., at row 344) can include determining its cost is C=7 since $C_1$=5 and $C_2$=2. As a result, memory cell frames of cost up to 6 precede this memory cell frame. Using the $L_2$ vector, that count equals the sum of the first 7 units of $L_2$ (1+2+3+4+5+6+5)=26 (e.g., 26 memory cell frames precede memory cell frame F).

Continuing the example, among memory cell frames of cost 7, by Rule 1, memory cell frames whose first-half cost is less than $C_1$ precede memory cell frame F. In this example, there are 3 such first-half costs: 2, 3, 4; and therefore, three such memory cell frames. If the first-half memory cell frame were to cost less than 2, the second-half would cost more than 5 to make the sum equal 7, but because 5 is the highest level in any cell, this is not an option in this example. Therefore, the index of F equals 26+3=29 (e.g., row 344).

As noted, the recursive expression is performed in $\log_2 N$ operations. Therefore, in an example where N=8, the expression can be performed in $\log_2 8$=3 operations. In the first operation, 8 can be reduced to an index of 4. In the second operation, 4 can be reduced to an index of 2, and in the final operation, 2 can be reduced to an index of 1, making it possible to have 2 half-length cell frames.

Encoding a given m-bit integer (e.g., the index I) to its corresponding memory cell frame F can include a recursive expression. Beginning with the $L_2$ vector mentioned above, the cost of F can be determined. For example, to determine F for integer 31, from $L_2$ vector, its cumulative sums vector $CL_2$=[1 3 6 10 15 21 26 30 33 35 36] can be computed, where 1 is the number of frames of length 2 with a cost up to zero, 3 is the number of frames of length 1 up to cost 1, etc. Since I=31 lies between the two entries 30 and 33 in $CL_2$, its cost is 8. Among the cost 8 memory cell frames, its index is its remainder R=I−30=1 (e.g., R=31−30=1). For example, 30 is the total number of memory cell frames of cost less than 8, which is entry number 8 in $CL_2$. Using the notation $C_1$, $C_2$, $I_1$, $I_2$ defined earlier, memory cell frames with first-half cost less than $C_1$ precede F (e.g., per Rule 1). $C_1$ and $C_2$ for memory cell frame F can be determined from this, long with a remainder, such that:

$$R = R - \Sigma_{c=0}^{C_1-1} L_1(c)L_1(8-c);$$

$$R = R - L_1(3)L_1(5).$$

The remainder can be determined until it reaches zero, in a number of embodiments. For example, when the remainder is zero, that particular operation is complete (e.g., it is the end of the recursion). For instance, each operation is performed, and at the end of each operation, a new remainder R, first half index $I_1$ and second half index $I_2$ are determined.

In the above example, $R=R-L_1(3)L_1(5)$ because no memory cell frame of cost 8 can have first-half cost less than 3; otherwise, the second-half cost exceeds 5, which is not allowed since there are only 6 levels per cell available. Therefore, R=1, $C_1$=4, and $C_2$=4. In this example, this accounts for the first term in the formula for I in the recursive expression. $I_1$ and $I_2$ can be computed from the same expression:

$$I_{1new} = R \bmod L_1(4); \text{ and}$$

$$I_{2new} = \frac{(R - I_1)}{L_1(4)},$$

which results in $I_{1new}$=0 and $I_{2new}$=0; memory cell frame F has a first-half cost which is the first among cost $C_1$=4 memory cell frames and a second-half cost which is the first among cost $C_2$=4 memory cell frames. This forces the two of them to be 4 and 4 and F=[4 4]. Since the memory cell frame length is N=2, the operation was finished in $\log_2 2$=1 operations. In general, $\log_2 N$ operations can be used to find the memory cell frame F given I. In general, there can be three updates in each operation:

$$R = R - \sum_{C=0}^{C-1} L_{\frac{n}{2}}(c) L_{\frac{n}{2}}(C - c);$$

$$I_{1new} = R \bmod L_{\frac{n}{2}}(C_1); \text{ and}$$

$$I_{2new} = \frac{(R - I_1)}{L_{\frac{n}{2}}(C_1)}.$$

In a number of embodiments, $I_{1new}+I_{2new}=I_{new}$, wherein $I_{new}$ includes a corresponding m-unit (e.g., binary) data pattern. $I_{new}$ can correspond to a new respective program state combination determined in response to an operation (e.g, recursion) of the recursive expression.

In an example where N=8, n=4, after the first operation, n=2 after the second operation, and n=1 after the third operation. In such an example, there are three levels of recursion.

The mapping can result in a proportion of higher levels in each memory cell in the memory cell frame being lower as compared to the lower levels. For instance, in an example including at least a million bits of random data including a mapping of 5-bit patterns per the mapping described with respect to FIG. 3, the resulting proportion of levels in each cell in the 2-cell memory cell frame is illustrated in Table 1.

TABLE 1

| Level in the Cell | Percentage Occurrence of the Level in Cell 1 | Percentage Occurrence of the Level in Cell 2 |
| --- | --- | --- |
| 0 | 18.7556 | 18.7518 |
| 1 | 18.7474 | 18.7348 |
| 2 | 18.7549 | 18.7579 |
| 3 | 18.7442 | 15.6166 |
| 4 | 15.6185 | 15.6364 |
| 5 | 9.3794 | 12.5025 |

Table 1 includes the program states in each cell for 2.5 bits-per-cell mapping. In the example, L=6, N=2, and m=5. The percentage occurrences of the level in cell 2 are lower than the percentage occurrences of the level in cell 1.

The parameters L, m, N used for the recursive expression to generate various fractional bits-per-cell cases can include those shown in Table 2.

TABLE 2

| Number of Levels in the Cell (L) | Number of Bits in the Data Pattern (m) | Number of Cells in the Memory Cell Frame (N) | Bits/Cell Achieved (m/N) |
|---|---|---|---|
| 2 | 1 | 1 | 1 |
| 3 | 3 | 2 | 1.5 |
| 4 | 2 | 1 | 2 |
| 5 | 9 | 4 | 2.25 |
| 6 | 5 | 2 | 2.5 |
| 7 | 11 | 4 | 2.75 |
| 8 | 3 | 1 | 3 |
| 9 | 25 | 8 | 3.125 |
| 10 | 13 | 4 | 3.25 |
| 11 | 27 | 8 | 3.375 |
| 12 | 7 | 2 | 3.5 |
| 13 | 29 | 8 | 3.625 |
| 14 | 15 | 4 | 3.75 |
| 15 | 31 | 8 | 3.875 |
| 16 | 4 | 1 | 4 |

When the recursive expression is applied to generate 3.75 bits per cell, mapping with the parameters (m, L, N)=(15, 14, 4), can result in proportions of levels in each of the four cells as illustrated in Table 3.

TABLE 3

| Level in the Cell | Percentage Occurrence of the Level in Cell 1 | Percentage Occurrence of the Level in Cell 2 | Percentage Occurrence of the Level in Cell 3 | Percentage Occurrence of the Level in Cell 4 |
|---|---|---|---|---|
| 0 | 8.3202 | 8.3156 | 8.2654 | 8.2667 |
| 1 | 8.2502 | 8.2440 | 8.1986 | 8.2043 |
| 2 | 8.1752 | 8.1660 | 8.1220 | 8.1054 |
| 3 | 8.0477 | 8.0595 | 8.0308 | 8.0166 |
| 4 | 7.9085 | 7.9268 | 7.8671 | 7.9001 |
| 5 | 7.7648 | 7.7469 | 7.6928 | 7.7138 |
| 6 | 7.5442 | 7.5352 | 7.5049 | 7.5094 |
| 7 | 7.3085 | 7.2950 | 7.2582 | 7.2589 |
| 8 | 7.0393 | 7.0231 | 7.0119 | 6.9779 |
| 9 | 6.7035 | 6.7220 | 6.6884 | 6.7139 |
| 10 | 6.3610 | 6.3742 | 6.3788 | 6.3827 |
| 11 | 5.9553 | 5.9678 | 6.0503 | 6.0452 |
| 12 | 5.5412 | 5.5389 | 5.6635 | 5.6394 |
| 13 | 5.0803 | 5.0853 | 5.2676 | 5.2657 |

The percentage occurrences levels decrease as the level increases, protecting the memory cell.

In a number of embodiments, a controller (e.g., controller 108) can determine the bit pattern stored in the group (e.g., in association with a read operation), and can provide the data to a host (e.g., host 102). The bit pattern stored in the group of cells can be decoded (e.g., via component 114) prior to being provided to the host (e.g., if previously encoded with error data).

The present disclosure includes methods and apparatuses for mapping between program states and data patterns. One method includes mapping a data pattern to a number of program state combinations corresponding to a group of memory cells configured to store a fraction number of data units per cell, wherein the mapping is based, at least partially, on a recursive expression performed in a number of operations, the number of operations based on a number of memory cells N and a number of program state combinations L.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory, comprising:
   determining, via a controller comprising control circuitry, an m unit data pattern to which a combination of program states of a number of memory cells corresponds based, at least partially, on a recursive expression,
   wherein the recursive expression is based on an index corresponding to the program states of each respective one of the number of memory cells and a cost associated with each respective one of the number of memory cells and corresponding to a voltage level of each respective one of the program states; and
   assigning, via the controller, the m unit data pattern to the combination of program states according to the m unit data pattern determination.

2. The method of claim 1, further comprising mapping the m unit data pattern to the combination of program states, wherein the number of memory cells are configured to store a fractional number of data units per cell.

3. The method of claim 1, further comprising encoding the m unit data pattern via the recursive expression.

4. The method of claim 1, further comprising determining a program state of each of the number of memory cells.

5. The method of claim 4, further comprising ordering each of the respective program states of each memory cell of the number of memory cells in order of increasing cost.

6. The method of claim 1, further comprising mapping the m unit data pattern to a memory cell comprising multiple units of data belonging to a single page of data.

7. The method of claim 1, further comprising programming the number of memory cells to a particular program state combination in accordance with a cost-based mapping.

8. An apparatus, comprising:
a controller comprising control circuitry coupled to an array of memory cells and configured to:
read a group of N memory cells programmable to L program states; and
determine a particular index for each of the L program states according to a cost-based mapping, wherein the index corresponds to each one of a number of program state combinations, and wherein the cost-based mapping comprises a total cost corresponding to each one of the respective number of program state combinations.

9. The apparatus of claim 8, wherein the group of N memory cells stores an m unit data pattern, and wherein L is a number of program states used to store m/N units of data per memory cell.

10. The apparatus of claim 8, wherein the total cost is a sum of costs corresponding to the respective program states of the respective number of program state combinations, with each of the L program states having a different cost corresponding thereto.

11. The apparatus of claim 8, wherein the group of N memory cells comprises fractional unit memory cells.

12. The apparatus of claim 8, wherein the controller is further configured to program each memory cell of the group such that a proportion of an occurrence of a first program state is lower than a proportion of an occurrence of a second program state,
wherein the first program state has a higher program state voltage level as compared to the second program state.

13. A method for operating a memory, comprising:
programming each memory cell of a group of N memory cells to a respective one of L program states such that a combination of the program states of the group maps to a received m unit data pattern determined using a cost-based mapping based, at least partially, on a recursive expression and including:
a first program state of the L program states comprising a first first-half cost ordered ahead of a second program state comprising a second first-half cost, wherein the second first-half cost is different than the first first-half cost.

14. The method of claim 13, further comprising receiving an m unit data pattern to be stored in the group of N memory cells, wherein the m unit data pattern is one of a number of m unit data patterns to which combinations of program states of the N memory cells are mapped.

15. The method of claim 13, further comprising the combination of the program states of the group mapping to the received m unit data pattern, wherein L is a number of program states used to store m/N units of data per memory cell.

16. The method of claim 13, wherein the second first-half cost is greater than the first first-half cost.

17. The method of claim 13, wherein the recursive expression comprises $$\left(\sum_{c=0}^{C-1} L_{\frac{n}{2}}(c) L_{\frac{n}{2}}(C-c)\right) + I_2 * L_{\frac{n}{2}}(C_1) + I_1,$$

wherein C is a cost of a memory cell program state of length N, LN(c) is a number of memory cell program states of length N that have a cost c, $I_1$ is an index of a first half of a memory cell program state within LN(c), and $I_2$ is an index of a second half of the memory cell program state.

18. The method of claim 17, wherein $I_1+I_2=I$, and wherein I corresponds to each one of the respective program state combinations.

19. The method of claim 13, including decoding the m unit data pattern via the recursive expression.

20. The method of claim 13, wherein the recursive expression includes a remainder R, a new first half index $I_{1new}$ determined in response to a first recursion of the recursive expression and a new second half index $I_{2new}$ determined in response to the first recursion of the recursive expression.

* * * * *